United States Patent
Okanuma et al.

(10) Patent No.: US 6,844,678 B2
(45) Date of Patent: Jan. 18, 2005

(54) SHORT ARC DISCHARGE LAMP

(75) Inventors: Tuneo Okanuma, Himeji (JP); Keisuke Okubo, Himeji (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 186 days.

(21) Appl. No.: 09/962,455

(22) Filed: Sep. 26, 2001

(65) Prior Publication Data

US 2003/0057835 A1 Mar. 27, 2003

(51) Int. Cl.⁷ .................................................. H01J 17/04
(52) U.S. Cl. ...................... 313/633; 313/631; 313/570; 313/632
(58) Field of Search ................................. 313/631–633, 313/217, 218, 570, 571, 309, 336, 351

(56) References Cited

U.S. PATENT DOCUMENTS

| | | | | |
|---|---|---|---|---|
| 4,303,848 A | * | 12/1981 | Shimizu et al. | 313/346 R |
| 4,633,136 A | * | 12/1986 | Fromm et al. | 313/623 |
| 4,906,895 A | * | 3/1990 | Pabst et al. | 313/632 |
| 4,937,495 A | * | 6/1990 | Gosslar et al. | 313/631 |
| 5,236,661 A | * | 8/1993 | Hidaka et al. | 420/428 |
| 5,420,477 A | * | 5/1995 | Sims et al. | 313/631 |
| 5,627,430 A | * | 5/1997 | Kira et al. | 313/570 |
| 5,629,585 A | * | 5/1997 | Altmann et al. | 313/570 |
| 5,920,152 A | * | 7/1999 | Yasuda et al. | 313/571 |
| 5,929,565 A | * | 7/1999 | Mayama et al. | 313/631 |
| 6,580,218 B2 | * | 6/2003 | Harada et al. | 313/631 |

FOREIGN PATENT DOCUMENTS

| | | | |
|---|---|---|---|
| DE | 1 012 382 | 6/1955 | |
| DE | 2059335 | * 11/1970 | ........... 82/3 |
| EP | 0 157 634 | 10/1985 | |
| FR | 1 124 860 | 5/1955 | |
| JP | 01-154425 | 6/1989 | |
| JP | 02-299121 | 12/1990 | |
| JP | 2782610 | 5/1992 | |
| JP | 04-137349 | 5/1992 | |

* cited by examiner

*Primary Examiner*—Sandra O'Shea
*Assistant Examiner*—Dalei Dong
(74) *Attorney, Agent, or Firm*—Nixon Peabody LLP; David S. Safran

(57) ABSTRACT

A short arc discharge lamp in which the wear on the cathode tip area is suppressed, in which moreover in the arc discharge only little polarization occurs and flickering in the arc discharge occurs only rarely, and thus, a reduction of illuminance or flickering on the light irradiation surface of a device or the like in which the short arc discharge lamp has been installed is prevented. Furthermore, a short arc discharge lamp is devised in which the radiance is hardly impaired and stable light emission is enabled, even when it is operated over a long time. To obtain these advantages, a short arc discharge lamp which has an essentially spherical arc tube in which there are a cathode and an anode opposite one another, is provided with a cathode in which the cathode tip area has a crystal structure formed of several crystals which, as compared to the crystal size in the back end area of the cathode, are coarsened, and in which the emissive material contained in the cathode tip area is less than or equal to 0.1% by mass.

15 Claims, 3 Drawing Sheets

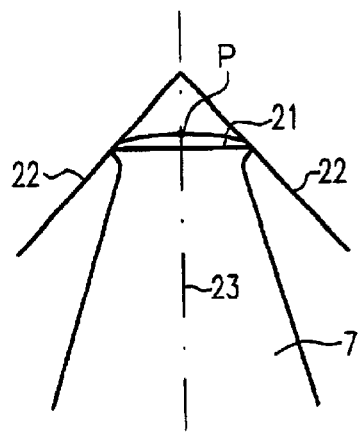
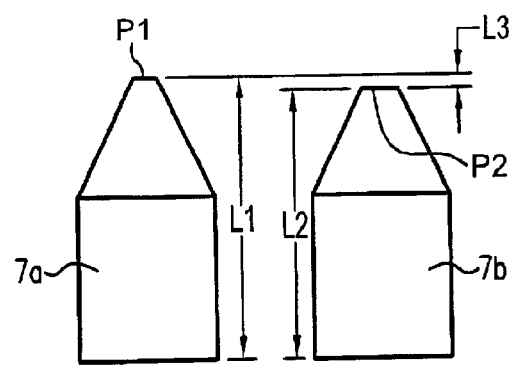
Fig.4(a)　　　　　Fig.4(b)
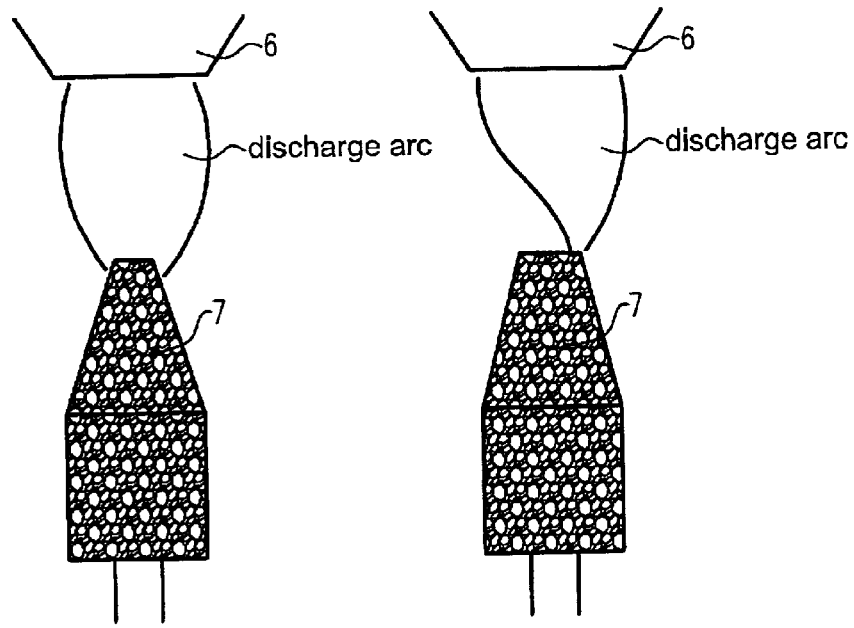
Fig.5(a)　　　　　Fig.5(b)
(Prior Art)　　　　(Prior Art)

SHORT ARC DISCHARGE LAMP

BACKGROUND OF THE INVENTION

1. Field of the Invention

The invention relates to a light source which is used in a photolithography process or the like in the production of semiconductors, liquid crystal cells and the like, or a light source for a projection apparatus using "digital micro mirror devices" and liquid crystals and the like, which is used for image projection system. The invention relates especially to the electrodes of a short arc discharge lamp.

2. Description of the Prior Art

Conventionally, for the cathode of a short arc discharge lamp, a metallic material with a high melting point is used and it is doped with an emissive material, for example, thoriated tungsten, i.e, tungsten which is doped with thorium oxide. This cathode is formed by the tip area of a cylindrical material being processed to be conical. The outermost tip area of the cathode is formed flat or spheroidal, so that a current density suitable to the lamp current is obtained. In this short arc discharge lamp, in the vicinity of the cathode tip, the highest radiance is achieved during luminous operation. The reason for this is that the vicinity of the cathode tip has the smallest diameter of the diameters of this cathode and that the highest current density is achieved here.

An optical device in which such a short arc discharge lamp is installed is conventionally built such that the focal point of the optical device agrees with the arc radiance spot part which is located in the vicinity of the cathode tip so that the area with high radiance of the cathode tip can be used with high efficiency. Generally, when the short arc discharge lamp is installed, the lamp position is set such that the maximum illuminance of the optical system is achieved. However, in the above described short arc discharge lamp, it is regarded as a disadvantage that the cathode is worn off over the period of illumination and the position of the arc radiance spot part on the tip of the cathode is shifted backwards in the direction toward an end of the lamp, for example, in the case of luminous operation, in an arrangement of the cathode in the lower area of the lamp, over the period of illumination, to the bottom. Therefore, the optimum focal point of the optical device is shifted and the illuminance of the light emitted by the optical system deteriorates dramatically. The reason for this is, presumably, that the current density is high on the cathode tip and the cathode temperature increases greatly. Conventionally, countermeasures are taken against this disadvantage by adjusting the lamp installation site of the optical device more often. But, frequent adjustment is not only complex, but during this adjustment, further adjustments must be made each time in addition to adjusting the lamp position, for example, adjusting of the exposure time or the like. As a result, the number of working steps is greatly increased.

As a process for preventing wear of the cathode tip, it can be imagined that the diameter of the cathode can be increased and the current density of the cathode tip decreased. However, if the current density is reduced, there is the disadvantage that the radiance of the arc radiance spot decreases. Furthermore, there are the disadvantages that an arc discharge takes place in which the discharge is locally polarized on the cathode tip and the arc discharge moves vigorously on the cathode tip and therefore becomes unstable. This instability of the arc discharge has the disadvantage that the emitted light becomes very unstable; for example, this causes nonuniform illuminance on an exposure surface in an exposure apparatus or the like, and in a projection apparatus or the like, leads to flickering of the projection images.

Furthermore, there is the disadvantage that, a tungsten rod is used as the material of the cathode in the above described short arc discharge lamp, mainly a thoriated tungsten rod, in which 2% by mass thorium oxide is normally added, and this thorium oxide is an emissive material and easily emits electrons during discharge. Thus, if the thorium oxide is not uniformly supplied over the entire cathode tip, both in terms of time and space, broadening and also contraction of the arc radiance spot, furthermore local concentration of the discharge and the like, occur. The thorium oxide is supplied either by diffusion along the grain boundaries of the tungsten material or by surface diffusion of the thorium oxide which has been deposited on the cathode surface. With respect to supply by surface diffusion, for example, Japanese Patent JP 2782610 B2 discloses that part of the surface of the conical area of the cathode tip is subjected to carbonization treatment. But, this process is also used to increase the amount of thorium oxide deposited on the side of the cathode. In this case, the above described supply is ensured by surface diffusion. The above described supply along the grain boundaries is however not ensured. Moreover, there is the disadvantage that a reduction in the supply amount of thorium oxide causes broadening of the arc radiance spot in the cathode tip area and that, conversely, for an excess supply amount of the thorium oxide, contraction of the arc radiance spot in the cathode tip area and flickering of the arc discharge occur.

FIGS. 5(a) and 5(b) each show an arc discharge state at the start of luminous operation and the crystal state of the cathode tip in a conventional short arc discharge lamp. FIG. 5(a) shows a discharge state on a conventional cathode with a relatively thin tip shape and the crystal state of this cathode. The particle size—hereinafter also called the crystal grain size—in the cathode tip area is roughly as large as on the side of the lead pin and is relatively small. For this relatively small crystal grain size, supply by diffusion of the thorium oxide along the grain boundaries is effective, as was described above. At the start of luminous operation there is a state of excess supply. The arc discharge encompassed the entire tip area, but the stability of the arc discharge was low. Since the diameter of the cathode tip is small and the current density on this cathode tip is high, and for similar reasons, the cathode tip area was worn to a great extent. This pushed the position of the cathode tip backwards, and in the optical system, an extreme reduction of the illuminance occurred.

FIG. 5(b) shows a case in which the tip was made thicker than in the case of FIG. 5(a), and in which the attempt was made to reduce the current density acting on this cathode. The particle size in the cathode tip area at the start of luminous operation is, as in FIG. 5(a), roughly as large as on the side of the lead pin and is relatively small. Stability of the arc discharge is lacking as in FIG. 5(a). The arc discharge shown in the drawings relates to a case in which it is polarized in part of the cathode tip. When this arc discharge is locally concentrated and manifested, the temperature of the cathode tip is rather nonuniform; this promotes wear of the cathode. Furthermore, if the polarized arc discharge is not manifested at one location, the emitted light becomes very unstable; in an exposure apparatus and the like, this causes the disadvantage of nonuniformity of the illuminance on the exposure surface and in a projection apparatus and the like, the disadvantage of flickering of the projection images.

SUMMARY OF THE INVENTION

A primary object of the present invention is to devise a short arc discharge lamp in which the wear on the cathode tip area is suppressed, moreover, in which only little polarization occurs in the arc discharge and flickering in the arc discharge occurs only rarely in order to prevent a reduction of illuminance or flickering on the light irradiation surface of a device or the like in which the short arc discharge lamp has been installed.

Furthermore, an object of the invention is to devise a short arc discharge lamp in which the radiance is hardly impaired and stable light emission is enabled, even when it is operated over a long time.

In a short arc discharge lamp which has an essentially spherical arc tube in which there are a cathode and an anode disposed opposite one another, these objects are achieved in accordance with the invention in that the cathode tip area has a crystal structure formed of several crystals which, proceeding from the back end of the cathode, are coarsened, and that the emissive material contained in the cathode tip area is less than or equal to 0.1% by mass.

These objects are furthermore achieved according to the invention by thorium oxide being contained as the emissive material.

These objects are moreover achieved according to the invention by the particles in the cathode tip area having an average particle size of from about 0.25 to 0.75 mm and the particles in the rear area having an average particle size of from about 0.02 to 0.1 mm.

The objects are also achieved in accordance with the invention by the thickness of the part in which the crystal grains are coarse being 0.1 mm to 3.0 mm proceeding from the outermost tip area.

The objects are additionally achieved according to the invention by the current density of the cathode tip area during luminous operation of the above described short arc discharge lamp being 30 A/mm$^2$ to 100 A/mm$^2$.

The invention is further described below with reference to the accompanying drawings.

BRIEF DESCRIPTION OF THE DRAWINGS

FIGS. 4(a) & 4(b) show the effect of luminous operation on the diameter of the cathode tip;

FIGS. 5(a) & 5(b) each show a schematic representation of the crystal state of the cathode tip and the arc discharge state in a conventional short arc discharge lamp;

DETAILED DESCRIPTION OF THE INVENTION

Figure 1:
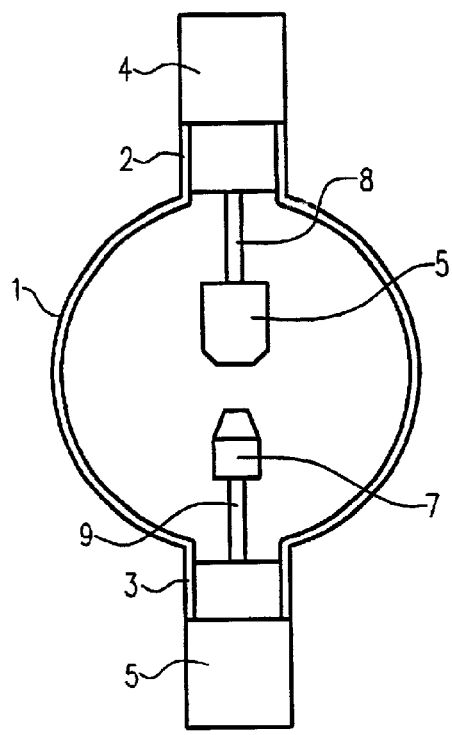
FIG. 1 is a schematic depiction of a short arc discharge lamp in accordance with the invention.

In FIG. 1, a short arc discharge lamp in accordance with the invention is shown which has an essentially spherical bulb part 1 which is made of quartz glass, which has roughly cylindrical sealing areas 2, 3 to seal opposite sides of the bulb part 1. These sealing areas 2, 3 are produced using a metal foil of Mo or the like which is, so to speak, sealed within the quartz tube, the quartz tube representing the outer periphery of these sealing areas. The metal foils electrically connect the electrodes 6, 7 to the outer components. A cylindrical base 4 is connected to the sealing area 2 and a cylindrical base 5 is connected to the sealing area 3. These bases 4 and 5 are made of a metal such as, for example, brass or the like. The interior of the bulb part 1 is filled, for example, with Xe gas as the rare gas with a resting pressure (at room temperature) of roughly 1.5×10$^6$ Pa. In the bulb part 1, the anode 6 and cathode 7 electrodes are disposed opposite one another. The anode 6 has an outside diameter of 25 mm and a total length of 30 mm and is made essentially cylindrical. The tip area of the anode 6 is machined to be frusto-conical. The head of the anode, i.e., the outermost tip area of the anode 6, is provided with a circular flat part with a diameter of 5 mm. The cathode 7 has an outside diameter of 15 mm and is made cylindrical. The tip area of the cathode 7 is machined to be frusto-conical such that the angle of the uppermost part is 60 degrees. The head of the cathode, i.e., the outermost tip area of the cathode 7, is provided with a circular flat part with a diameter of 1.5 mm. The anode 6 and the cathode 7 are held securely by an inner lead pin 8 and an inner lead pin 9. The inner lead pins 8, 9 are each held securely by the sealing areas 2 and 3 so that the sealing of the bulb part is preserved and they are electrically connected at the same time to the outer components. The invention relates to such a short arc discharge lamp, the feature of the invention especially relating to the formation of the cathode 7.

Figure 2:
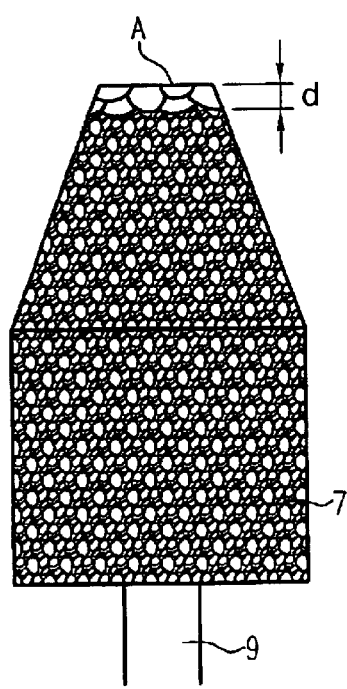
FIG. 2 schematically shows the crystal structure of the cathode used in accordance with the invention.

FIG. 2 schematically shows the crystal state of the cathode 7. Proceeding from the tip area A of the cathode 7, which has been worked to be frusto-conical, in the direction toward the terminal side of the inner lead pin 9, in the area with a thickness d, the tungsten particles are coarser than the crystal grains on the side of the lead pin 9. Therefore, it is the tip area of the cathode in which the average size of the particles is greater than in the remaining area of the cathode. This coarsening takes place essentially to the extent that, for example, in a cathode with a tip which has a diameter of 1.5 mm, there are several crystal grains, like some few grains to a dozen and some grains. This amount of coarsening of the crystal grains corresponds to the correct amount of thorium oxide which is supplied and distributed along the grain boundaries. At this amount, both disappearance and also excess supply of thorium oxide are prevented. This amount is desirable to obtain a stable arc discharge.

For an average particle size of the untreated cathode material in the rear area of the cathode being in a range of from 0.02 to 0.1 mm the tip area of the cathode is preferably treated such as to yield an average particle size of the coarsened particles of from about 0.25 to 0.75 mm. Thus, the average particle size of the coarsened particles is roughly ten times higher than that of the untreated cathode material. In the present example, the average particle size of the untreated particles in the rear area is 0.045 mm and the average particle size of the treated particles in the tip area is 0.4 mm.

In the invention, the average particle size is determined using a micrographic method. First, a micrograph or photo is taken from a section through the cathode in a direction perpendicular to the cathode axis. In the micrograph, a straight line is drawn intersecting the cathode and its length is determined. Then, the number of the grains through which the straight line passes is determined. Division of the length of the straight line by the number of intersected grains gives the average particle size of the grains in the respective region of the cathode where the micrograph was taken.

The amount of thorium oxide contained in the coarse crystal grains which form the tip area of the cathode 7 is less than or equal to 0.1% by mass. The thoriated tungsten used for the cathode 7 contains roughly 2% by mass thorium oxide. The state in which the thoriated tungsten contains roughly 2% by mass thorium oxide is kept unchanged, for example, on the side of the inner lead pin 9 of the cathode 7. However, it is necessary for the crystal grain size to be increased at the cathode tip and moreover for the thorium oxide contained in these coarsened crystal grains to be less than or equal to 0.1% by mass. Furthermore, it is advantageous when, at the start of luminous operation, there is no thorium oxide in the cathode tip in order to reduce the effect of the thorium oxide which has been supplied in excess at the start of luminous operation of the short arc discharge lamp. At a thorium oxide content at least equal to 0.1%, there were cases in which the thorium oxide was supplied to excess and the arc discharge was locally concentrated.

It is a good idea for the thickness d of the area which has been formed on the cathode tip with the coarsened crystal grains to be in the range from 0.1 mm to 3.0 mm, which is a suitable range for stabilization of the arc discharge. When this thickness d is less than or equal to 0.1 mm, the amount of thorium oxide which is supplied from the grain boundary of the coarsened tungsten particles formed on the cathode tip by diffusion may become unduly large, by which a stable arc discharge cannot be obtained. Conversely, if this thickness d is greater than 3.0 mm, the amount of thorium oxide supplied from the grain boundary may be too little. Here, the disadvantage is that the arc radiance spot of the cathode tip broadens more than necessary and the amount of light in the case of installation in an optical system is inadequate, as well as similar disadvantages.

In the embodiment shown using FIG. 2, the diameter of the tip of the cathode is 1.5 mm, the luminous current is roughly 88 A and the current density of the cathode tip is roughly 50 A/mm$^2$. This current density has an intrinsic relationship to the wear of the cathode tip. One suitable value of the range of current density of the cathode tip is 30 A/mm$^2$ to 100 A/mm$^2$. When this current density becomes high, i.e., is greater than 100 A/mm$^2$, the temperature of the cathode tip may become high, by which the wear on the cathode tip becomes serious. When the current density is less than 30 A/mm$^2$, a uniform arc discharge over the entire tip area of the cathode may not be achieved and a locally concentrated arc discharge occurs, by which stable illuminance cannot be obtained.

Figure 3:
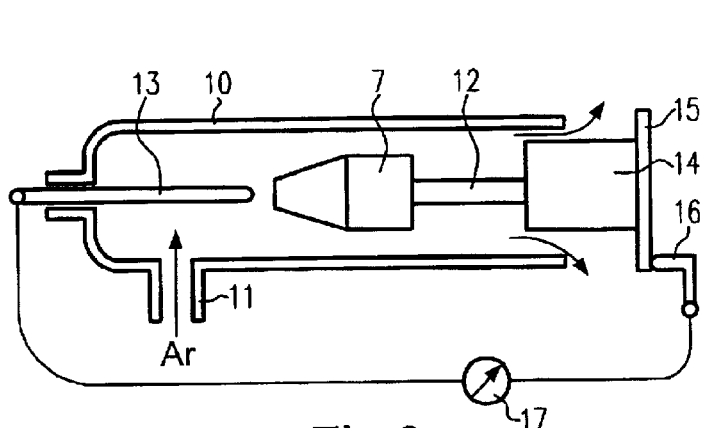
FIG. 3 shows a schematic of a device for treatment using a direct current discharge in which a cathode according to the invention is subjected to discharge treatment.

FIG. 3 schematically shows a treatment device using a direct current discharge for producing the above described coarse crystal grains. In this treatment device, on an end of a treatment basin 10 which is made of a quartz glass tube, there is a rare gas inflow opening 11. From this opening 11, a rare gas, such as for example Ar or the like, is allowed to flow in for a few dozen seconds, by which the air in the treatment basin 10 is replaced by this rare gas. In the treatment basin 10, the cathode 7 for the above described short arc discharge lamp is slipped onto the electrode holding pin 12, is held securely by it, and thus, is installed on the side of the positive electrical charge (on the anode side) of the device. On the side of the negative electrical charge (on the cathode side) of the device, a needle-shaped electrode 13 is installed. The position relative to the cathode 7 as the article to be treated can be adjusted. The cathode 7, in the state in which it is held securely by the electrode holding pin 12, is connected to the positive side of a direct current source 17 via a rotary device 14, a receiving panel 15 and a supply brush 16. The negative side of the direct current source is connected to an end of the above described needle-shaped electrode 13.

The production of the above described coarse crystal grains is described below.

An electrode of thoriated tungsten which is used as a cathode 7 for the above described short arc discharge lamp, is installed on the anode side of the treatment device using a direct current discharge. For example, Ar gas is allowed to flow in as the rare gas. Between the tip area of the cathode 7 and the needle-shaped electrode 13, a discharge is produced by turning the cathode 7 in this air flow. In this treatment device, using a direct current discharge, for example a 70 A discharge current, is applied to the cathode 7. By heating the cathode 7, in this way, its temperature is increased up to the melting point of the tungsten material (roughly 3,380° C.). This discharge treatment melts the tip of the cathode 7 as the article to be treated. This heat treatment produces coarsened crystal grains. The size of the crystal grains of the tip of the cathode 7 is changed by the discharge current in the treatment device being controlled using a direct current discharge and the temperature being changed at the point which corresponds to the area of the cathode 7 to be treated. The desired size of the crystals can be adjusted, for example, by repeated treatment, after maintaining a temperature of roughly 3,000° C. for a period of a few seconds, the temperature being increased up to the melting point of the tungsten material and this temperature being maintained for a few seconds.

Since the tip area of the cathode melts by the above described heat treatment, the thorium oxide contained in the thoriated tungsten which is the base material of the cathode also vaporizes at the same time during heat treatment and is for the most part released to the outside by the cathode. For this reason the amount of thorium oxide as the emissive material which is contained in the coarsened crystal grains formed in the tip area of the cathode is less than or equal to 0.1% by mass. Since the content of thorium oxide in the area which is composed of several coarsened crystal grains, i.e., in the tip area of the cathode, becomes small, excess supply of thorium oxide is prevented.

With a short arc discharge lamp in which the cathode 7 was installed, comparative luminous operation with a case using a conventional cathode was carried out. In the above described short arc discharge lamp, the bulbs were filled with 30 mg/cc mercury and Xe gas as the rare gas at a resting pressure of 2.0×10$^5$ Pa. The distance between the electrodes in this lamp was 5 mm. The lamp was operated with an input electric power of 4300 W.

In the case of luminous operation of the above described short arc discharge lamp, the cathode tip is consumed in the course of luminous operation and gradually becomes spheroidal, by which the shape of the cathode tip area compared to the start of luminous operation changes to a great extent. As shown in FIGS. 4(*a*) & 4(*b*), the amount of backward motion of the cathode tip and the change of the diameter of the tip were measured and established. In the enlarged representation of the cathode tip as shown in FIG. 4(*a*), a line formed between the intersection points was established as the diameter of the tip 21, these intersection points being formed between a tangent, i.e., a virtual line 22, and the cathode 7. The virtual line 22 with respect to the cathode axis 23 which represents the direction of the large major axis of the cathode 7 has an angle of 45°. As shown in FIG. 4(b), the amount of backward motion of the tip was measured and established as L3. Here, L3 is the difference between the distance L2 from the lead pin side of this cathode 7b to the outermost tip area of the cathode, i.e., the point P2 in the representation, and a length L1 of an initial cathode 7a as far as the outermost tip area P1.

Figure 6:
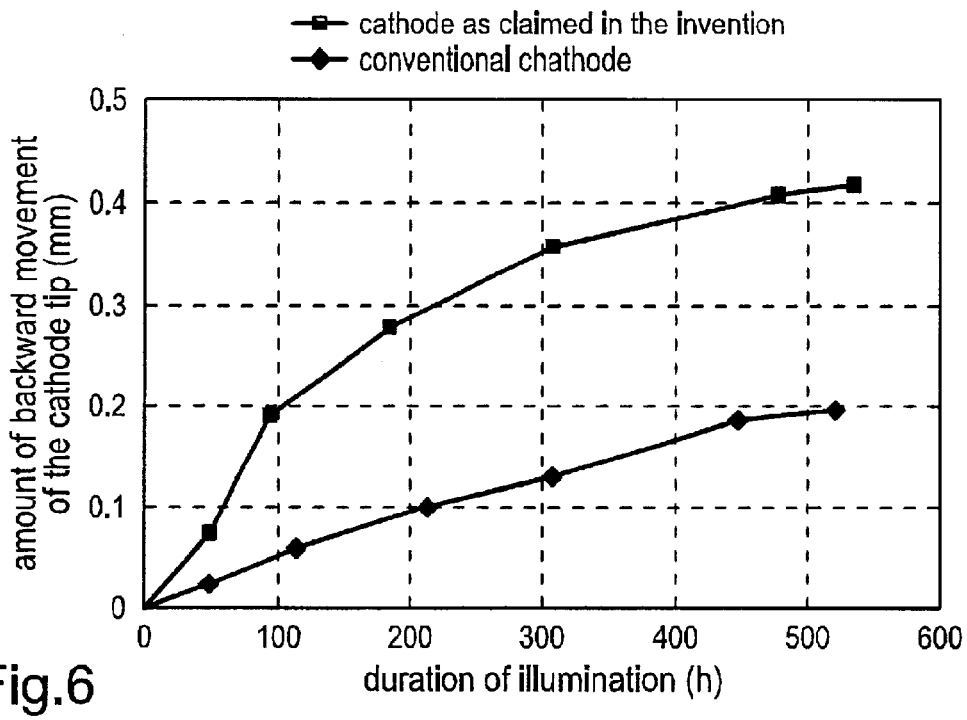
FIG. 6 is a graph comparing the amount of wear of the cathode tip relative to the duration of illumination for a conventional lamp and a lamp made according to the invention.

FIG. 6 shows a schematic in which the duration of illumination of the short arc discharge lamp using the above described cathode was compared to the amount of backward motion of the tip. Here, the y-axis plots the amount of backward motion of the cathode tip using the length, while the x-axis plots the duration of illumination of the above described short arc discharge lamp. If, at a duration of illumination of roughly 500 hours, a comparison is made to the conventional amount of backward motion of the cathode tip, the amount of change was roughly ½. That is, the amount of backward motion was 0.2 mm.

Figure 7:
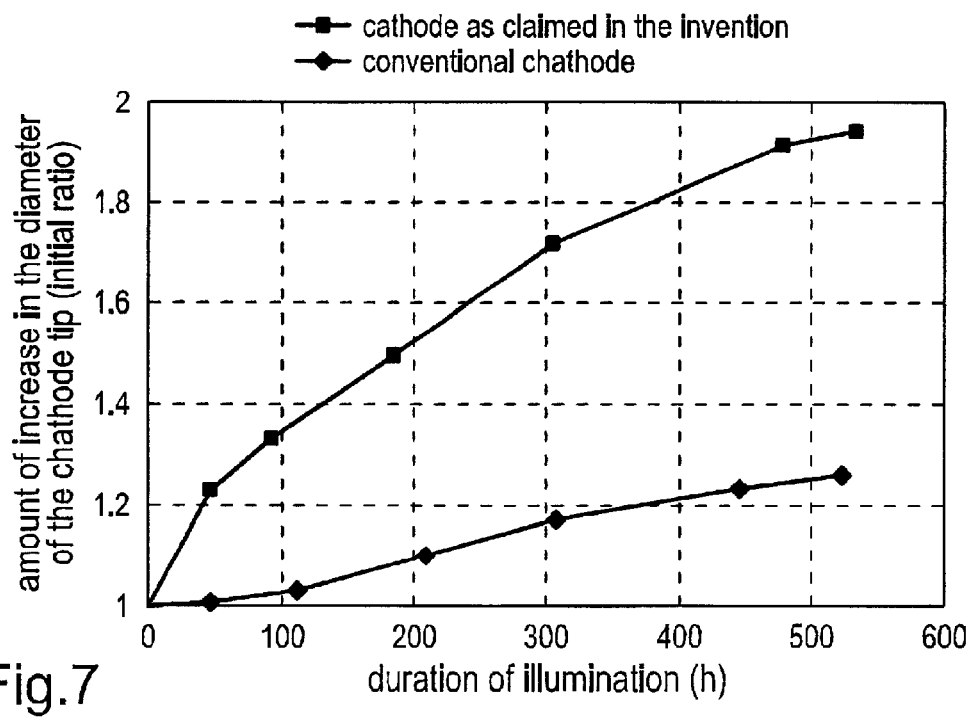
FIG. 7 is a graph comparing the amount of increase of the diameter of the cathode tip relative to the length of illumination in a conventional lamp and a lamp made in accordance with the invention.

FIG. 7 is a schematic in which the duration of illumination of the lamp was compared to the amount of increase of the diameter of the tip using the above described cathode. Here, the y-axis plots the amount of increase of the diameter of the cathode tip with relative values, while the x-axis plots the duration of illumination of the short arc discharge lamp. For a length of illumination of roughly 500 hours, the diameter of the tip for a conventional cathode roughly doubles at its periphery, while it was at most roughly 1.2 times as great as at the start in the cathode as of the present invention.

ACTION OF THE INVENTION

In the tip area of the cathode of the short arc discharge lamp, coarse crystal grains of tungsten with a thorium oxide content of less than or equal to 0.1% by mass are formed in accordance with the invention. This measure suppresses the wear of the cathode tip of the short arc discharge lamp by luminous operation. Furthermore, according to the invention, in a device in which the short arc discharge lamp is installed, the reduction of the illuminance on the irradiation surface, due to divergence of the arc radiance spot from the focal point of the optical system and as a result of broadening of the arc radiance spot, is decreased. Thus, a short arc discharge lamp can be devised by which stable radiance is obtained over a long time.

What is claimed is:

1. Short arc discharge lamp comprising:
   an essentially spherical arc tube;
   a cathode and an anode disposed opposite one another within the arc tube;
   wherein the cathode is composed of a plurality of particles which contain an emissive material, wherein said particles are larger in a cathode tip area than in a rear cathode area, and wherein the emissive material contained in the cathode tip area is present in a proportion of equal to or less than 0.1% by mass relative to the mass of the cathode tip area; and wherein the particles in the cathode tip area have an average particle size of from about 0.25 to 0.75 mm and the particles in the rear area have an average particle size of from about 0.02 to 0.1 mm.

2. Short arc discharge lamp as claimed in claim 1, wherein the emissive material is thorium oxide.

3. Short arc discharge lamp as claimed in claim 2, wherein the particles comprise tungsten.

4. Short arc discharge lamp as claimed in claim 1, wherein the particles comprise tungsten.

5. Short arc discharge lamp as claimed in claim 1, wherein the cathode tip area has a thickness of 0.1 mm to 3.0 mm proceeding from a frontmost point of the cathode tip.

6. Short arc discharge lamp as claimed in claim 2, wherein the cathode tip area has a thickness of 0.1 mm to 3.0 mm proceeding from a frontmost point of the cathode tip.

7. Short arc discharge lamp as claimed in claim 3, wherein the cathode tip area has a thickness of 0.1 mm to 3.0 mm proceeding from a frontmost point of the cathode tip.

8. Short arc discharge lamp as claimed in claim 4, wherein the cathode tip area has a thickness of 0.1 mm to 3.0 mm proceeding from a frontmost point of the cathode tip.

9. Lamp device as claimed in claim 1, wherein the entire body of the cathode in said rear area is fanned of particles of said average particle size.

10. Lamp device comprising a short arc discharge lamp having an essentially spherical arc tube; a cathode and an anode disposed opposite one another within the arc tube;
    wherein the cathode is composed of a plurality of particles which contain an emissive material, wherein said particles are larger in a cathode tip area than in a rear cathode area, and wherein the emissive material contained in the cathode tip area is present in a proportion of equal to or less than 0.1% by mass relative to the mass of the cathode tip area; and wherein the particles in the cathode tip area have an average particle size of from about 0.25 to 0.75 mm and the particles in the rear area have an average particle size of from about 0.02 to 0.1 mm; and
    a power supply, wherein the power supply is adapted to produce, during luminous operation, a current density of the cathode tip area of the short arc discharge lamp of 30 A/mm$^2$ to 100 A/mm$^2$.

11. Lamp device as claimed in claim 10, wherein the emissive material is thorium oxide.

12. Lamp device as claimed in claim 10, wherein the particles comprise tungsten.

13. Lamp device as claimed in claim 10, wherein the cathode tip area has a thickness of 0.1 mm to 3.0 mm proceeding from a frontmost point of the cathode tip.

14. Lamp device as claimed in claim 12, wherein the cathode tip area has a thickness of 0.1 mm to 3.0 mm proceeding from a frontmost point of the cathode tip.

15. Lamp device as claimed in claim 10, wherein the entire body of the cathode in said rear area is formed of particles of said average particle size.

* * * * *